(12) United States Patent
Shroff et al.

(10) Patent No.: US 8,399,310 B2
(45) Date of Patent: Mar. 19, 2013

(54) NON-VOLATILE MEMORY AND LOGIC CIRCUIT PROCESS INTEGRATION

(75) Inventors: Mehul D. Shroff, Austin, TX (US); Mark D. Hall, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 215 days.

(21) Appl. No.: 12/915,726

(22) Filed: Oct. 29, 2010

(65) Prior Publication Data

US 2012/0104483 A1 May 3, 2012

(51) Int. Cl.
*H01L 21/335* (2006.01)
*H01L 21/8232* (2006.01)

(52) U.S. Cl. . 438/142; 438/588; 438/591; 257/E21.423; 257/E29.309; 977/773

(58) Field of Classification Search .................. 438/142, 438/286, 263, 264, 591, 594; 257/324, 410, 257/E21.294, E21.423, E29.001, E29.309; 977/773
See application file for complete search history.

(56) References Cited

U.S. PATENT DOCUMENTS

| | | | |
|---|---|---|---|
| 6,531,734 B1 * | 3/2003 | Wu | ................................. 257/315 |
| 6,939,767 B2 | 9/2005 | Hoefler et al. | |
| 7,154,779 B2 | 12/2006 | Mokhlesi et al. | |
| 7,208,793 B2 | 4/2007 | Bhattacharyya | |
| 7,365,389 B1 | 4/2008 | Jeon et al. | |
| 7,391,075 B2 | 6/2008 | Jeon et al. | |
| 7,405,968 B2 | 7/2008 | Mokhlesi et al. | |
| 7,439,134 B1 | 10/2008 | Prinz et al. | |
| 7,476,582 B2 | 1/2009 | Nakagawa et al. | |
| 7,544,490 B2 | 6/2009 | Ferrari et al. | |
| 7,544,990 B2 | 6/2009 | Bhattacharyya | |
| 7,560,767 B2 | 7/2009 | Yasuda et al. | |
| 2007/0224772 A1 | 9/2007 | Hall et al. | |
| 2007/0249129 A1 | 10/2007 | Hall et al. | |
| 2009/0179283 A1 * | 7/2009 | Adams et al. | .................. 257/411 |
| 2009/0256211 A1 * | 10/2009 | Booth et al. | .................. 257/407 |

* cited by examiner

OTHER PUBLICATIONS

U.S. Appl. No. 12/710,111, Method for Forming a Split-Gate Memory Cell, Inventor Sung-Taeg Kang, et al., filed Feb. 22, 2010.

*Primary Examiner* — Charles Garber
*Assistant Examiner* — Abdulfattah Mustapha
(74) *Attorney, Agent, or Firm* — Daniel D. Hill; James L. Clingan, Jr.

(57) ABSTRACT

A method of making a logic transistor in a logic region of a substrate and a non-volatile memory cell in an NVM region of the substrate includes forming a gate dielectric layer on the substrate. A first polysilicon layer is formed on the gate dielectric. The first polysilicon layer is formed over the NVM region and removing the first polysilicon layer over the logic region. A dielectric layer is formed over the NVM region including the first polysilicon layer and over the logic region. A protective layer is formed over the dielectric layer. The dielectric layer and the protective layer are removed from the logic region to leave a remaining portion of the dielectric layer and a remaining portion of the protective layer over the NVM region. A high-k dielectric layer is formed over the logic region and the remaining portion of the protective layer. A first metal layer is formed over the high K dielectric layer. The first metal layer, the high K dielectric, and the remaining portion of the protective layer are removed over the NVM region to leave a remaining portion of the first metal layer and a remaining portion of the high K dielectric layer over the logic region. A conductive layer is deposited over the remaining portion of the dielectric layer and over the first metal layer. The NVM cell and the logic transistor are formed and this includes patterning the conductive layer.

10 Claims, 10 Drawing Sheets

NON-VOLATILE MEMORY AND LOGIC CIRCUIT PROCESS INTEGRATION

BACKGROUND

1. Field

This disclosure relates generally to integrated circuits, and more specifically, to a non-volatile memory and logic circuit process integration.

2. Related Art

Many semiconductor devices include, or embed, non-volatile memory (NVM) transistors with other transistor types on the same integrated circuit (IC). The manufacturing processes for the different transistor types may not be the same, requiring that the processes be integrated. For example, to integrate NVM with, for example, CMOS (complementary metal oxide semiconductor), the CMOS process may be modified to include the process steps necessary to fabricate the NVM memory cell and the supporting devices.

Flash NVM is commonly embedded in, for example, system-on-a-chip (SoC) integrated circuits having CMOS logic circuitry. The flash NVM may include a floating gate comprising polysilicon, or use a charge storage layer comprising nanocrystals or an ONO (oxide-nitride-oxide) layer. The memory cell may also include a control gate comprising polysilicon, a metal, or both. In addition, it may be desirable to use a high-k (where k refers to the dielectric constant of the material) gate dielectric in the logic transistor. Integrating the non-volatile memory cell with the logic transistor having the metal gate and the high-k gate dielectric on the same integrated circuit may require many additional process steps.

What is needed is a process integration methodology to efficiently embed a NVM cell array with metal gate/high-k dielectric logic transistors.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a method for making a semiconductor device having non-volatile memory cell transistors and CMOS logic transistors. The semiconductor device includes two polysilicon layers, or a polysilicon layer and a metal layer, where the NVM cell floating gate or select gate are formed from the first polysilicon layer and the control gates of the NVM transistor and the logic transistor are formed from the second polysilicon layer or the metal layer. The method includes forming a high-k gate dielectric layer on the logic transistor region, where high-k means greater than about 4.5. An ONO layer or a nanocrystal layer may be formed over the first polysilicon layer and used as a charge storage layer in place of a floating gate.

In one aspect, there is provided, a method of making a logic transistor in a logic region of a substrate and a non-volatile memory cell in an NVM region of the substrate, comprising: forming a gate dielectric layer on the substrate; forming a first conductive layer on the gate dielectric; patterning the first conductive layer over the NVM region and removing the first conductive layer over the logic region; forming a dielectric layer over the NVM region including the first conductive layer and over the logic region; forming a protective layer over the dielectric layer; removing the dielectric layer and the protective layer from the logic region to leave a remaining portion of the dielectric layer and a remaining portion of the protective layer over the NVM region; forming a high-k dielectric layer over the logic region and the remaining portion of the protective layer; forming a first metal layer over the high-k dielectric layer; removing the first metal layer, the high-k dielectric, and the remaining portion of the protective layer over the NVM region to leave a remaining portion of the first metal layer and a remaining portion of the high-k dielectric layer over the logic region; forming a second conductive layer over the remaining portion of the dielectric layer and over the first metal layer; and forming the NVM cell and the logic transistor including patterning the second conductive layer. The step of forming the first conductive layer may comprise forming a first polysilicon layer and the step of forming the second conductive layer may comprise forming a second polysilicon layer. The step of forming the second conductive layer may comprise forming a second metal layer. The step of forming the second conductive layer may further comprise forming a first polysilicon layer over the second metal layer. The step of forming the second conductive layer may be further characterized by the second metal layer being thicker than the first metal layer. The step of forming the second conductive layer may be further characterized by the first metal and the second metal layer having a same work function. The step of forming the dielectric layer may comprise forming a charge storage layer comprising a first insulating layer, a plurality of nanocrystals over the first insulating layer, and a second insulating layer around and over the plurality of nanocrystals including the oxide layer. The step of forming the NVM cell and logic transistor may further comprise patterning the charge storage layer aligned to the second conductive layer such that charge storage layer has portion on the substrate and under the second conductive layer. The step of forming the NVM cell and the logic transistor may further comprise patterning the remaining portion of the first conductive layer to form a floating gate. The method may further comprise removing the gate dielectric from the logic region prior to forming the high-k dielectric.

In another aspect, there is provided, a non-volatile memory cell and a logic transistor on a substrate, comprising: a first gate dielectric comprising silicon dioxide over the substrate; a second gate dielectric of high-k material over the substrate spaced from the first gate dielectric; a portion of a first conductive layer over the first gate dielectric; a first portion of a first metal layer on the second gate dielectric; a dielectric layer over the portion of the first conductive layer; a first portion of a second metal layer over the portion of the first metal layer; a second portion of the second metal layer over the dielectric layer; a first portion of a second conductive layer over the first portion of the second metal layer; and a second portion of the second conductive layer over the second portion of the second metal layer. The first metal layer and the second metal layer may have the same work function. The dielectric layer may comprise a charge storage layer comprising a first insulating layer, a plurality of nanocrystals over the first insulating layer, and a second insulating layer around and over the plurality of nanocrystals may include the oxide layer. The dielectric layer may comprise a first oxide insulating layer, a silicon nitride insulating layer over the first oxide insulating layer, and a second oxide insulating layer over the silicon nitride insulating layer. The portion of the first conductive layer may be a floating gate comprising polysilicon. The second conductive layer may comprise polysilicon.

In yet another aspect, there is provided, a method of forming a logic transistor and a non-volatile memory cell, comprising: forming a gate dielectric layer on the substrate; depositing a first conductive layer over the gate dielectric layer; patterning the first conductive layer to leave a portion of the first conductive layer; forming a dielectric layer over the substrate after patterning the first conductive layer wherein the dielectric layer has a top insulating layer comprising silicon dioxide; forming a silicon nitride layer over the dielectric layer; patterning the silicon nitride layer and the dielectric layer to leave a portion of the dielectric layer and a portion of the silicon nitride layer over and extending around the portion of the first conductive layer; depositing a high-k dielectric layer over the substrate after patterning the silicon nitride layer and the dielectric layer depositing a first metal layer over the high-k dielectric layer; removing the first metal layer, the high-k dielectric layer, and the silicon nitride layer from over the dielectric layer to leave a portion of the dielectric layer and a portion of the first metal layer over the portion of the dielectric layer; forming a second conductive layer over the substrate after removing the first metal layer, the high-k dielectric layer, and the silicon nitride layer from over the dielectric layer; and forming the non-volatile memory cell and logic transistor including patterning the second conductive layer to leave a first portion of the second conductive layer over the portion of the first metal layer and a second portion of the second conductive layer over the portion of the dielectric layer. The step of forming the first conductive layer may comprise forming a first polysilicon layer and the step of forming the second conductive layer may comprise depositing a second metal layer and depositing a second polysilicon layer directly on the second metal layer. The step of forming the second conductive layer may comprise depositing a polysilicon layer over the substrate including directly on the portion of the first metal layer and directly on the portion of the dielectric layer. The step of forming the non-volatile memory may comprise etching the portion of the first conductive layer to form a select gate and the step of forming the dielectric layer may comprise forming a layer of nanocrystals.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

FIG. 1 through FIG. 10 illustrate cross sectional views of steps for making a semiconductor device in accordance with an embodiment of the present invention.

Figure 1:
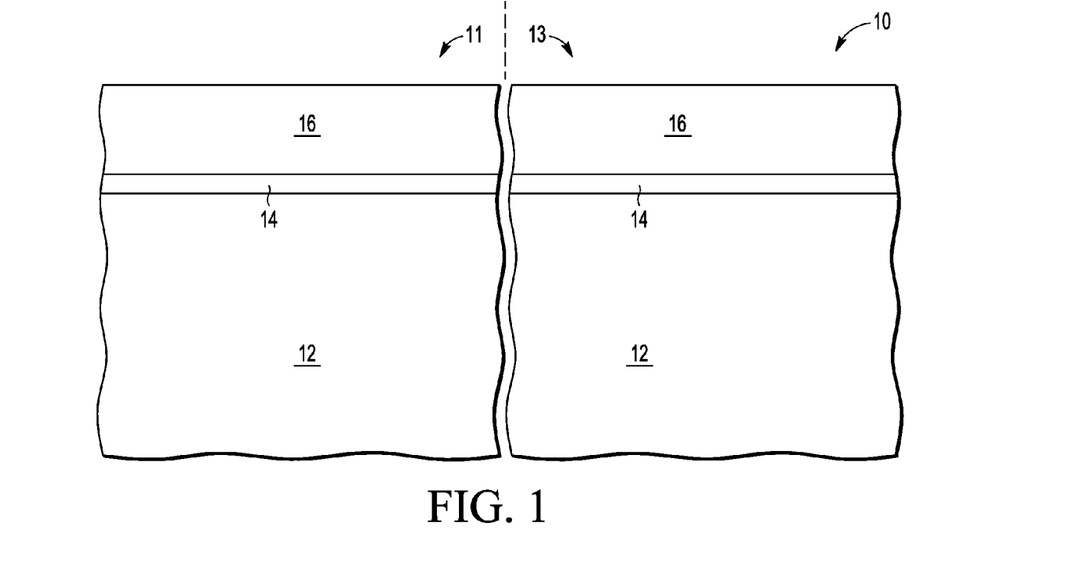
FIG. 1 through FIG. 10 illustrate cross sectional views of steps for making a semiconductor device in accordance with an embodiment of the present invention.

FIG. 1 illustrates a semiconductor device 10 having a semiconductor substrate 12. Substrate 12 is divided into two regions. Region 11 is a non-volatile memory (NVM) cell region. Region 13 is a CMOS logic transistor region. Semiconductor substrate 12 can be any semiconductor material or combinations of materials, such as gallium arsenide, silicon germanium, silicon-on-insulator (SOI), silicon, monocrystalline silicon, the like, and combinations of the above. Insulating layer 14 is formed over a surface of substrate 12 in both region 11 and region 13. Insulating layer 14 may be any suitable gate dielectric. The dielectric layer may be either grown and/or deposited. In one embodiment, insulating layer 14 is grown silicon dioxide. Polysilicon layer 16 is deposited on insulating layer 14 in both region 11 and region 13. In one embodiment, polysilicon layer 16 is 800 to 2000 angstroms thick.

Figure 2:
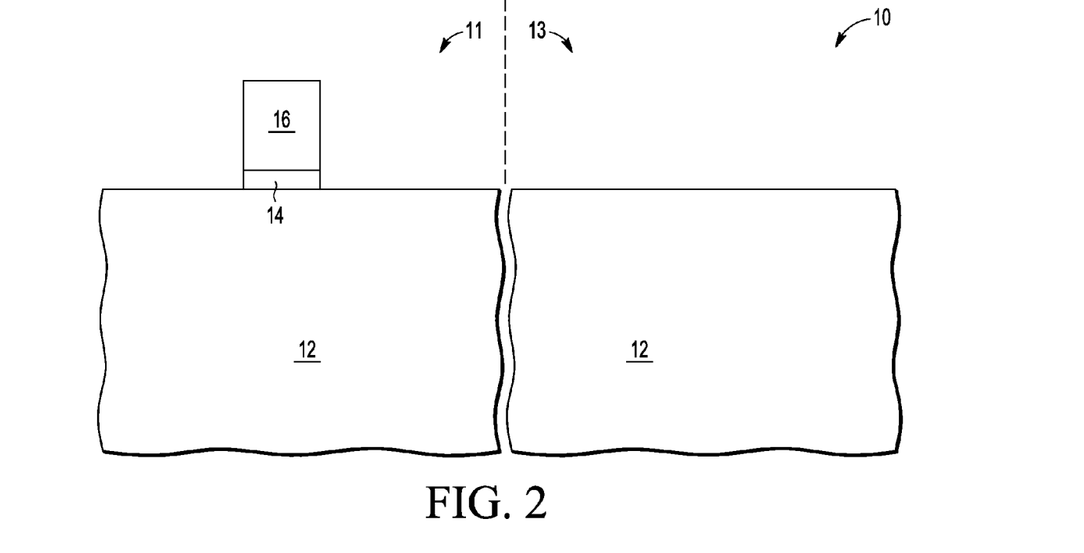

FIG. 2 illustrates semiconductor device 10 after polysilicon layer 16 and insulating layer 14 are patterned. In the illustrated embodiment, patterned polysilicon layer 16 will be a select gate for an NVM cell. In another embodiment, as will be described below, the patterned polysilicon layer 16 can be a floating gate.

Figure 3:
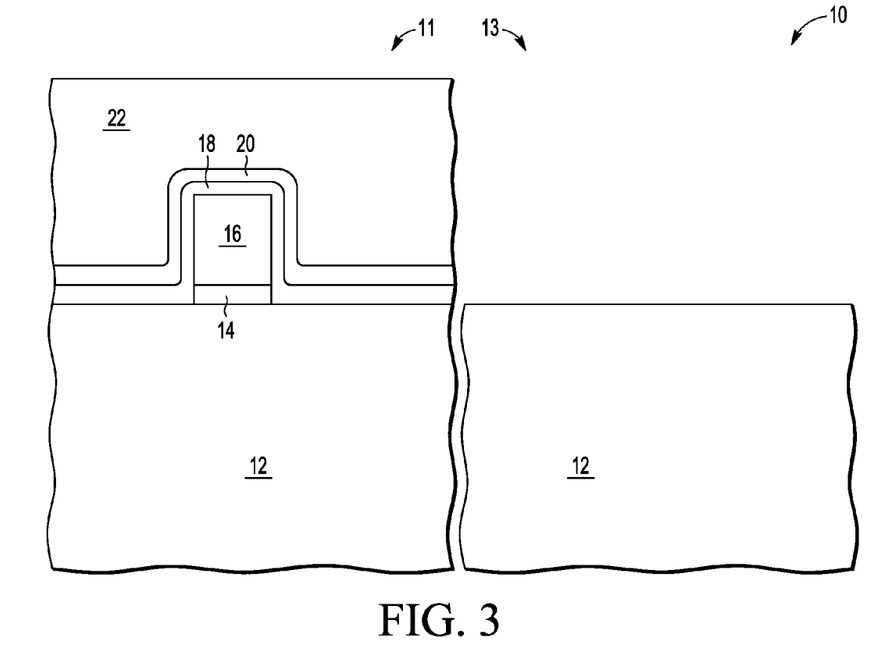

FIG. 3 illustrates semiconductor device 10 after charge storage layer 18 and protective layer 20 are formed. Charge storage layer 18 is a conventional charge storage layer and may be a single layer or may comprise a plurality of layers (not shown). Charge storage layer 18 may include a plurality of nanocrystals for storing charge. The plurality of nanocrystals is isolated by an insulating material such as silicon dioxide. In one embodiment, charge storage layer 18 is formed in multiple layers (not shown), where a first dielectric layer is formed and nanocrystals are formed on the first dielectric layer. The nanocrystals may be formed from polysilicon, germanium, metal, or other suitable material. In another embodiment, silicon nitride may be used to form charge storage regions in charge storage layer 18. A second dielectric layer is formed over the nanocrystals to isolate the nanocrystals from subsequently formed layers. Protective layer 20 may be formed from silicon nitride. The silicon nitride may be between 50 and 200 angstroms thick. The silicon nitride protective layer 20 will function to protect charge storage layer 18 during subsequent processing steps. A photoresist layer 22 is formed on protective layer 20 and patterned to cover NVM region 11.

Figure 4:
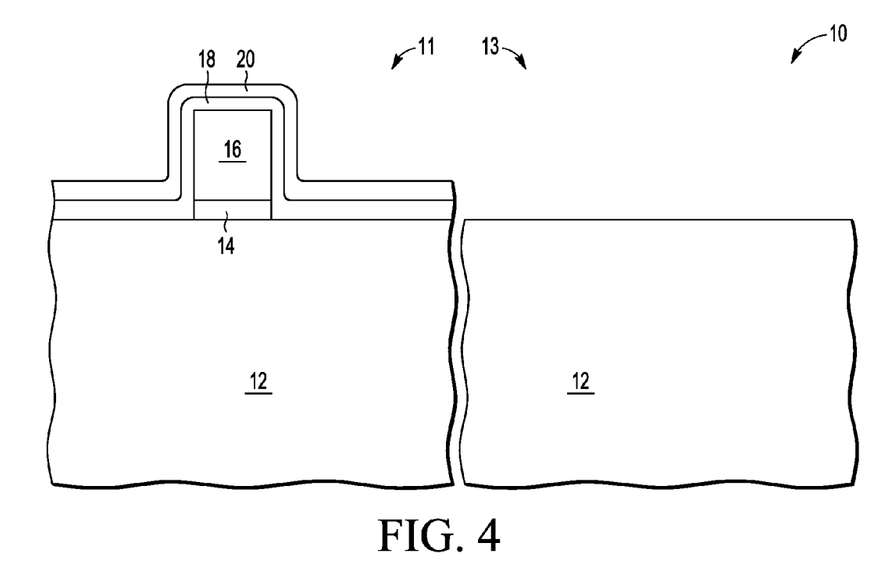

FIG. 4 illustrates semiconductor device 10 after charge storage layer 18 and protective layer 20 are removed from logic transistor region 13 and after removing photoresist 22 from NVM region 11. Charge storage layer 18, protective layer 20, and photoresist 22 are removed using conventional semiconductor processing techniques. The removal of protective layer 20 and charge storage layer 18 may be accomplished in a single step by sequentially etching protective layer 20 followed by etching charge storage layer 18.

Figure 5:
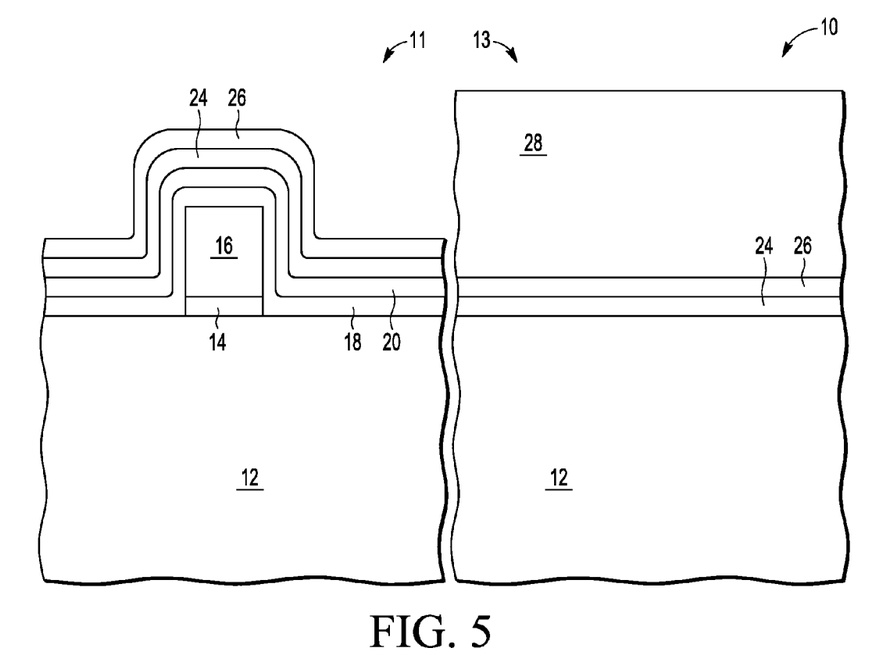

FIG. 5 illustrates semiconductor device 10 after formation of a high-k dielectric 24 and barrier layer 26. High-k dielectric 24 will form the gate dielectric for the logic transistors in region 13. Suitable high-k dielectric materials include, for example, $HfO_2$, $Al_2O_3$, and HfSiON. Barrier layer 26 is a conductive barrier layer and can include TiN, TaN, WN, TiAlN, CoSi, TaSiN, or a combination thereof. Also, barrier layer 26 may be formed using the same metal as a subsequent metal layer. Photoresist layer 28 is formed over semiconductor device 10 and patterned to remove the photoresist material from over NVM region 11.

Figure 6:
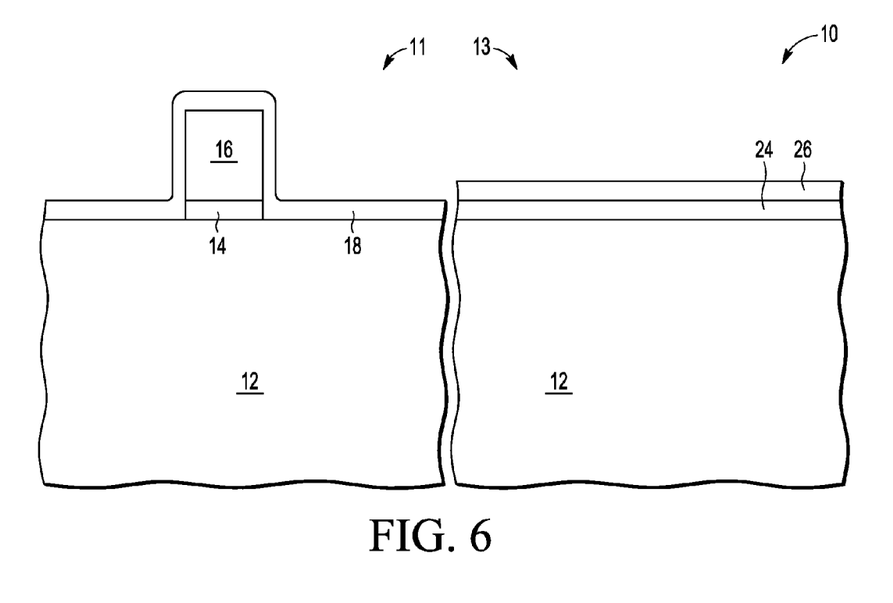

FIG. 6 illustrates semiconductor device 10 after metal barrier layer 26, high-k dielectric layer 24, and protective layer 20 are removed from over charge storage layer 18 in NVM region 11. In the case where charge storage layer 18 comprises an ONO structure or a nanocrystal structure, silicon nitride protective layer 20 provides protection to the ONO structure or nanocrystal structure, but can be easily removed without causing damage to the ONO structure or nanocrystal structure. Photoresist layer 28 is then removed from over metal barrier layer 26 in logic transistor region 13. Metal barrier layer 26, high-k dielectric layer 24, and protective layer 20 can be removed sequentially in the same etch step. Also, the etch process may have an isotropic component to ensure that residual spacers of metal barrier layer 26, portions of high-k dielectric layer 24, and portions of protective layer 20 do not remain over charge storage layer 18.

Figure 7:
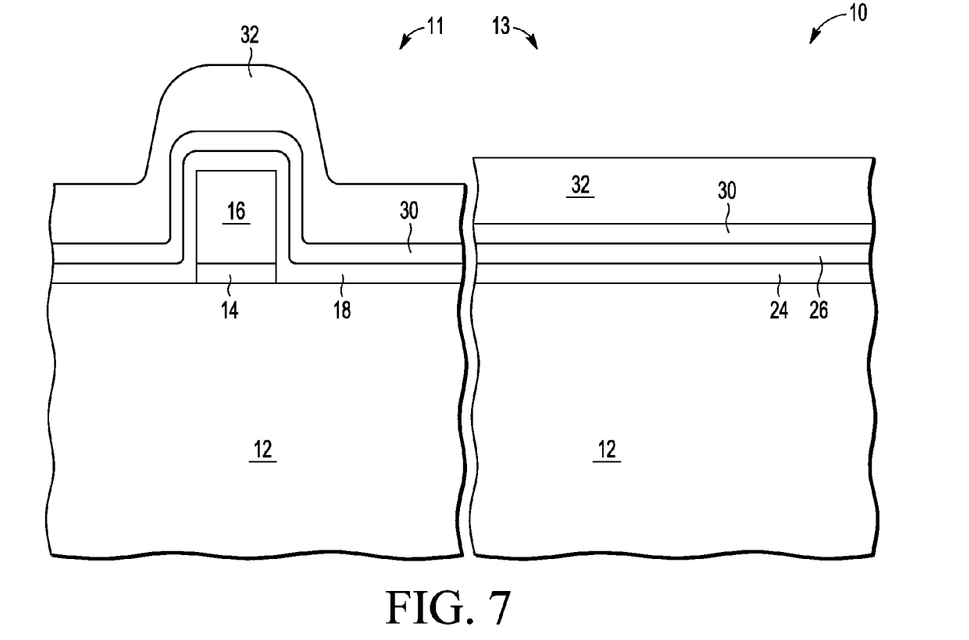

FIG. 7 illustrates semiconductor device 10 after barrier layer 30 and metal gate 32 are formed over charge storage layer 18 in NVM region 11 and over barrier layer 26 in logic transistor region 13. Following the formation of barrier layer 30, NVM region 11 includes a single metal barrier layer and logic transistor region 13 includes two metal barrier layers, where the combination of metal barrier layers 26 and 30 provides a double thickness of barrier metal. Metal barrier layer 30 sets the work function for transistors in region 13. Metal barrier layer 30 may be similar in composition and thickness as barrier layer 26, but can also be different. If the control gate is formed from polysilicon, barrier layer 30 is not needed. In the case where control gate is polysilicon, barrier layer 30 needs to be thick enough to act as an etch stop, while the thickness of barrier layer 26 is such that in conjunction with the first barrier layer (i.e., total barrier layer thickness for logic), it is sufficient to set the work function. Generally, a thickness of about 50-80 Angstroms is sufficient to act as an etch stop while about 100-120 Angstroms is sufficient to set the work function.

In the case where the control gate is metal, both barrier layers need to be thick enough to set the work function. Additionally, the first barrier layer also needs to act as an etch stop.

Having a thickness greater than required to set the work function or act as an etch stop, as the case may be, is generally not a detriment.

Figure 8:
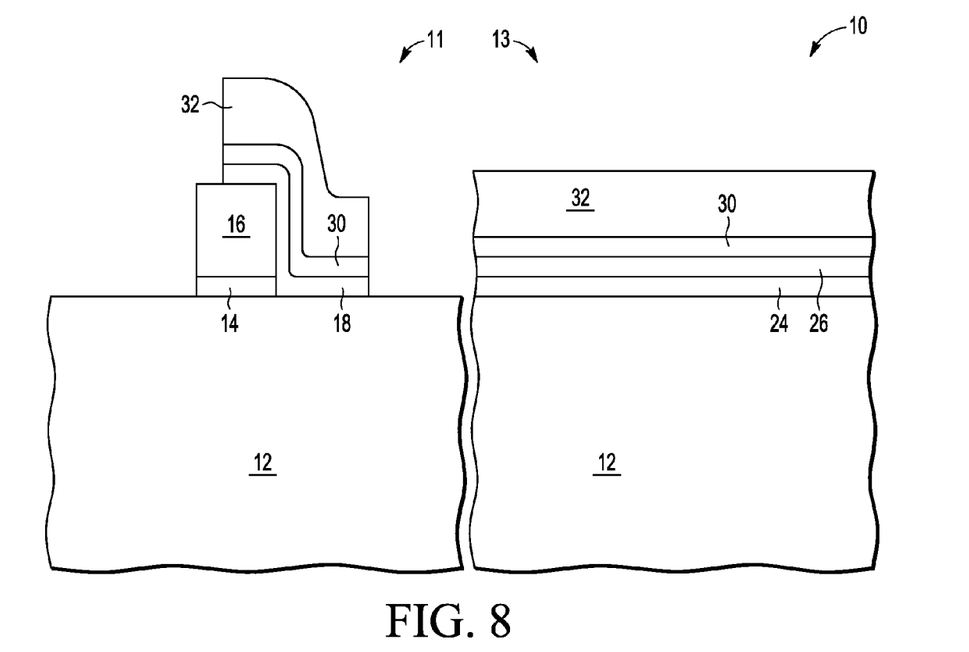

FIG. 8 illustrates semiconductor device 10 after a split-gate type NVM cell has been patterned. In one embodiment, an array of split-gate type NVM cells would be formed.

Figure 9:
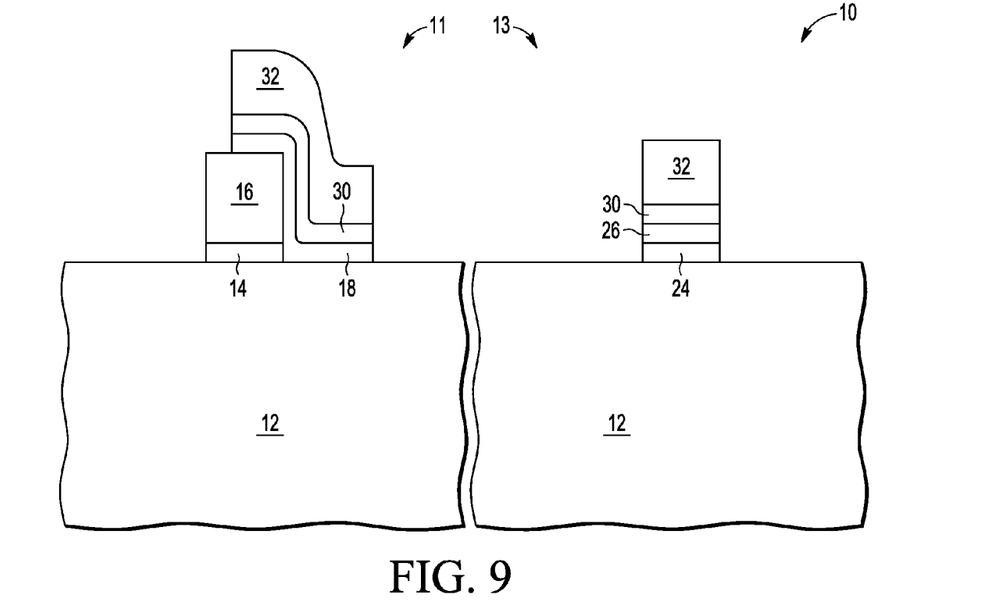

FIG. 9 illustrates semiconductor device 10 after a logic transistor has been patterned. In one embodiment, more than one logic transistor will be formed.

Figure 10:
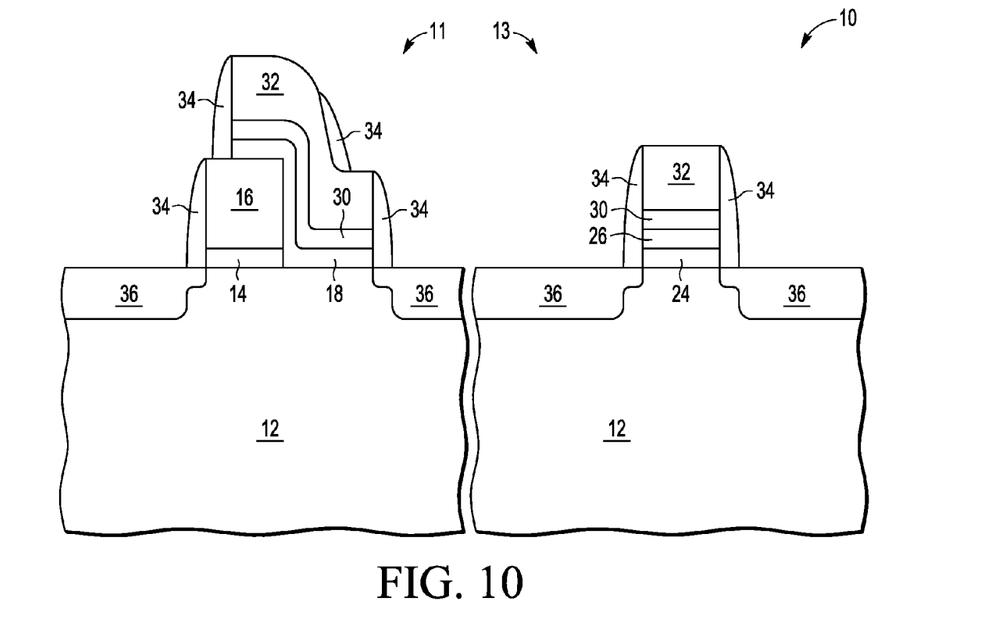

FIG. 10 illustrates semiconductor device 10 after further processing is performed. For example, sidewall spacers 34 are formed on sidewalls of the NVM transistors and the logic transistors. Also, source/drain regions 36 are formed in substrate 12. In addition, one or more metal interconnect layers (not shown) may be formed over semiconductor device 10 to provide electrical connections for the logic transistors, memory cells, and other components on semiconductor device 10.

Note that in another embodiment, the logic transistor region may include different transistor stacks for NMOS and PMOS transistors that would be integrated in the same manner. Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of a semiconductor device.

FIG. 11 through FIG. 20 illustrate cross-sectional views of steps for making a semiconductor device in accordance with another embodiment of the present invention.

Figure 11:
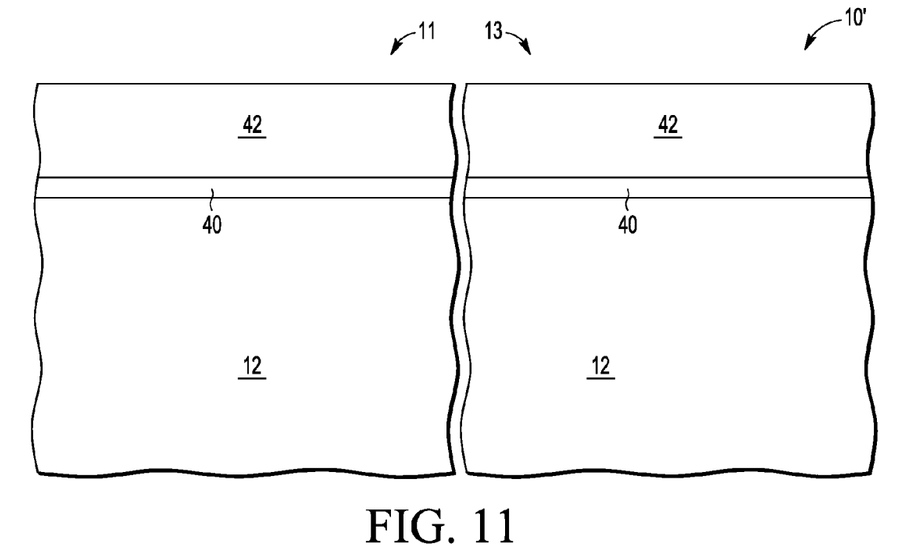
FIG. 11 through FIG. 20 illustrate cross-sectional views of steps for making a semiconductor device in accordance with another embodiment of the present invention.

FIG. 11 illustrates a semiconductor device 10' having a semiconductor substrate 12. Substrate 12 is divided into two regions. Region 11 is a non-volatile memory (NVM) cell region. Region 13 is a CMOS logic transistor region. Semiconductor substrate 12 can be any semiconductor material or combinations of materials, such as gallium arsenide, silicon germanium, silicon-on-insulator (SOI), silicon, monocrystalline silicon, the like, and combinations of the above. Insulating layer 40 is formed over a surface of substrate 12 in both region 11 and region 13. Insulating layer 40 may be any suitable gate dielectric. The dielectric layer may be either grown and/or deposited. In one embodiment, insulating layer 40 is grown silicon dioxide. Polysilicon layer 42 is deposited on insulating layer 40 in both region 11 and region 13. In one embodiment, polysilicon layer 42 is 800 to 2000 angstroms thick.

Figure 12:
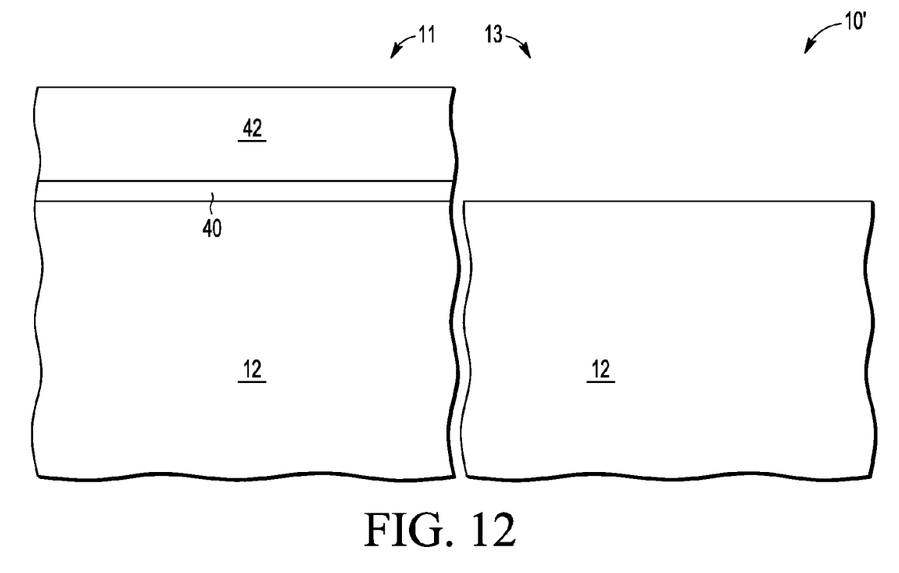

FIG. 12 illustrates semiconductor device 10' after polysilicon layer 42 and insulating layer 40 are patterned. In one embodiment the patterned polysilicon layer 42 is a floating gate. In another embodiment, patterned polysilicon layer 42 can be a select gate for a split gate NVM cell.

Figure 13:
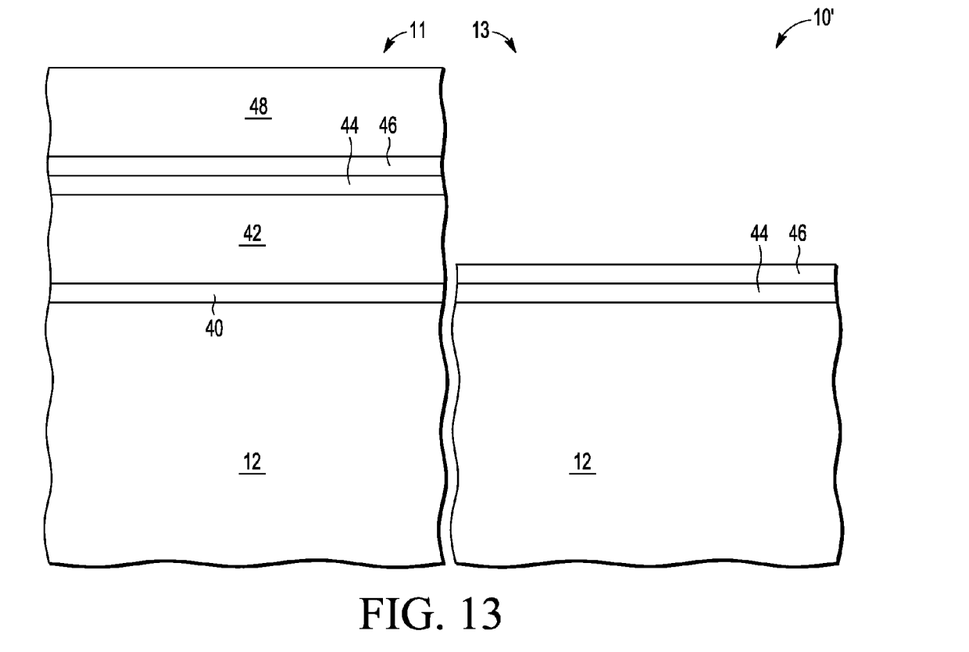

FIG. 13 illustrates semiconductor device 10' after charge storage layer 44 and protective layer 46 are formed. Charge storage layer 44 is a conventional charge storage layer and may be a single layer or may comprise a plurality of layers (not shown). Charge storage layer 44 may include a plurality of nanocrystals for storing charge. The plurality of nanocrystals is isolated by an insulating material such as silicon dioxide. In one embodiment, charge storage layer 44 is formed in multiple layers (not shown), where a first dielectric layer is formed and nanocrystals are formed on the first dielectric layer. The nanocrystals may be formed from polysilicon, germanium, metal, or other suitable material. In another embodiment, silicon nitride may be used to form charge storage regions in charge storage layer 44. A second dielectric layer is formed over the nanocrystals to isolate the nanocrystals from subsequently formed layers. Protective layer 46 may be formed from silicon nitride. The silicon nitride may be between 50 and 200 angstroms thick. The silicon nitride will function to protect charge storage layer 44 during subsequent processing steps. A photoresist layer 48 is formed on protective layer 46 and patterned to cover NVM region 11.

Figure 14:
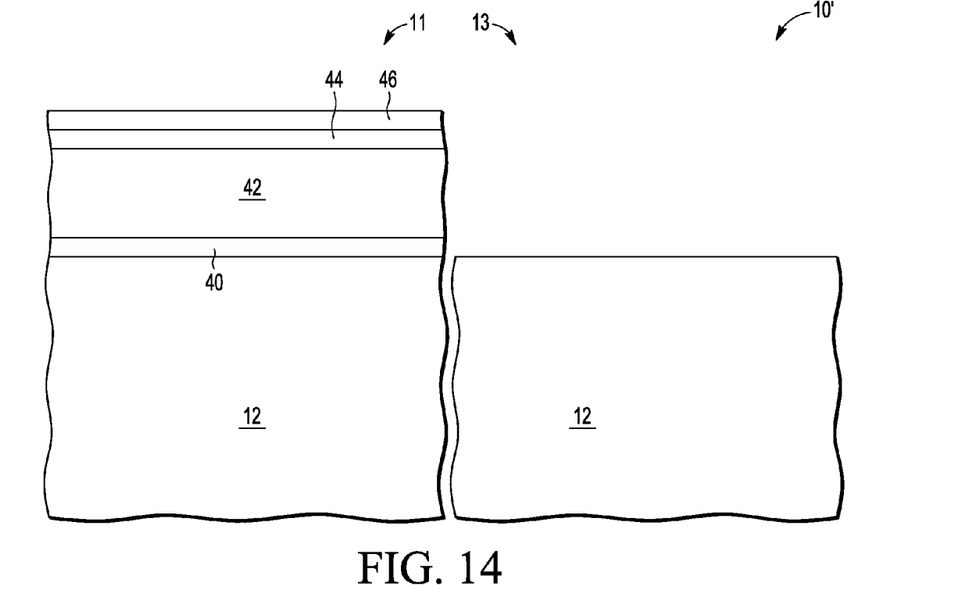

FIG. 14 illustrates semiconductor device 10' after charge storage layer 44 and protective layer 46 are removed from logic transistor region 13 and after removing photoresist 48 from NVM region 11. Charge storage layer 44, protective layer 46, and photoresist 48 are removed using conventional semiconductor processing techniques. The removal of protective layer 46 and charge storage layer 44 may be accomplished in a single step by sequentially etching protective layer 46 followed by etching charge storage layer 44.

Figure 15:
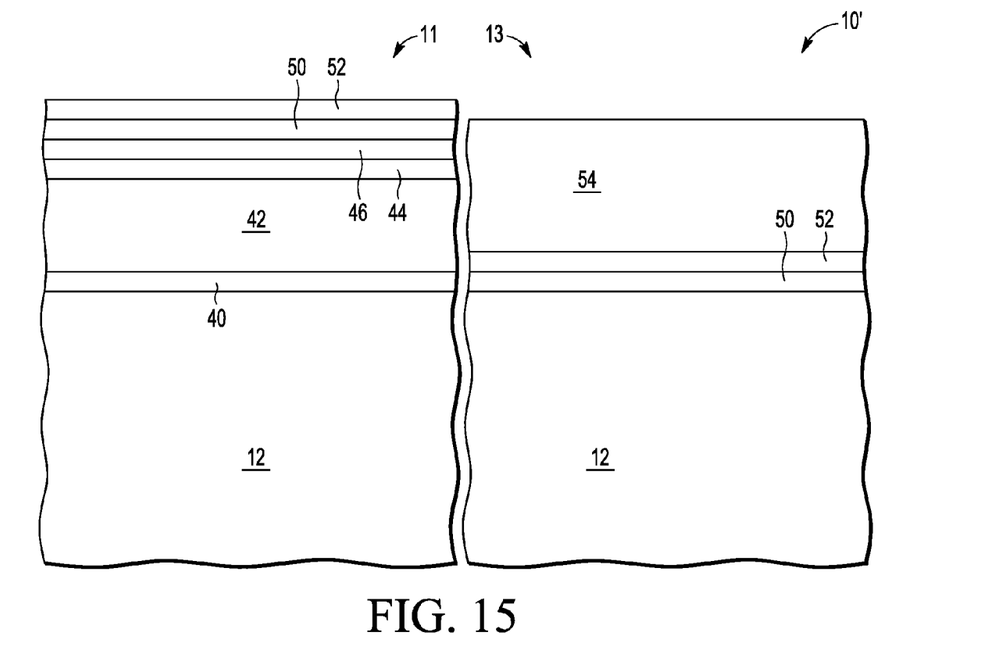

FIG. 15 illustrates semiconductor device 10' after formation of a high-k dielectric 50 and barrier layer 52. Suitable high-k dielectric materials include, for example, $HfO_2$, $Al_2O_3$, and HfSiON. High-k dielectric 50 will form the gate dielectric for the logic transistors in region 13. Barrier layer 52 is a conductive barrier layer and can include TiN, TaN, WN, TiAlN, CoSi, TaSiN, or a combination thereof. Also, barrier layer 52 may be formed using the same metal as a subsequent metal layer. Photoresist layer 54 is formed over semiconductor device 10' and patterned to remove the photoresist material from over NVM region 11.

Figure 16:
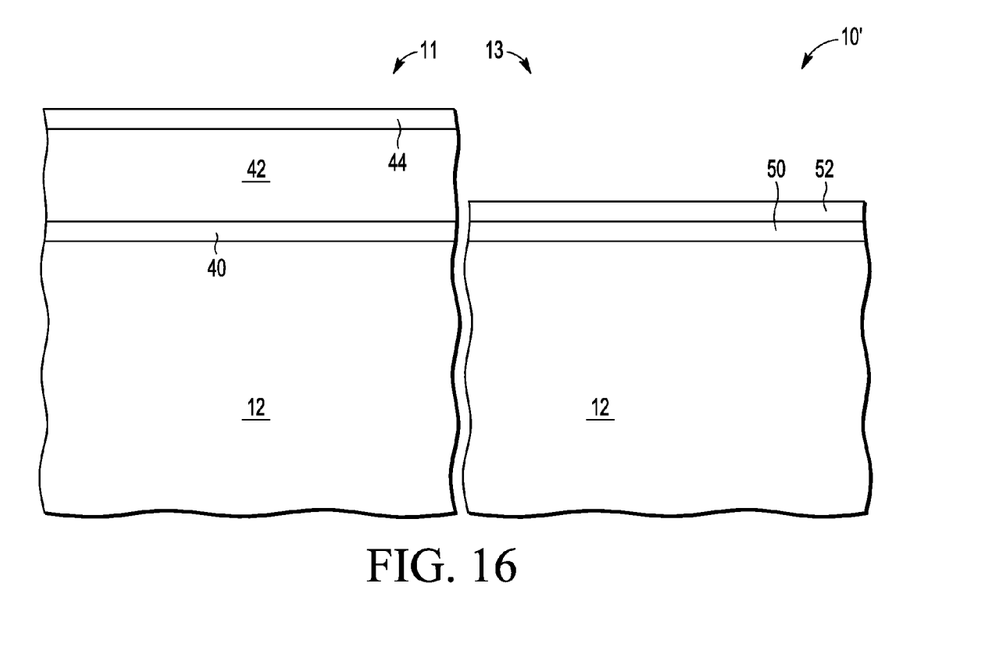

FIG. 16 illustrates semiconductor device 10' after barrier layer 52, high-k dielectric layer 50, and protective layer 46 are removed from over charge storage layer 44 in NVM region 11. In the case where charge storage layer 44 comprises an ONO structure or a nanocrystal structure, silicon nitride protective layer 46 provides protection to the ONO structure or nanocrystal structure, but can be easily removed without causing damage to the ONO structure or nanocrystal structure. Photoresist layer 54 is then removed from over barrier layer 52 in logic transistor region 13. Metal barrier layer 52, high-k dielectric layer 50, and protective layer 46 can be removed sequentially in the same etch step. Also, the etch process may have an isotropic component to ensure that residual spacers of metal barrier layer 52, portions of high-k dielectric layer 50, and portions of protective layer 46 do not remain over charge storage layer 44.

Figure 17:
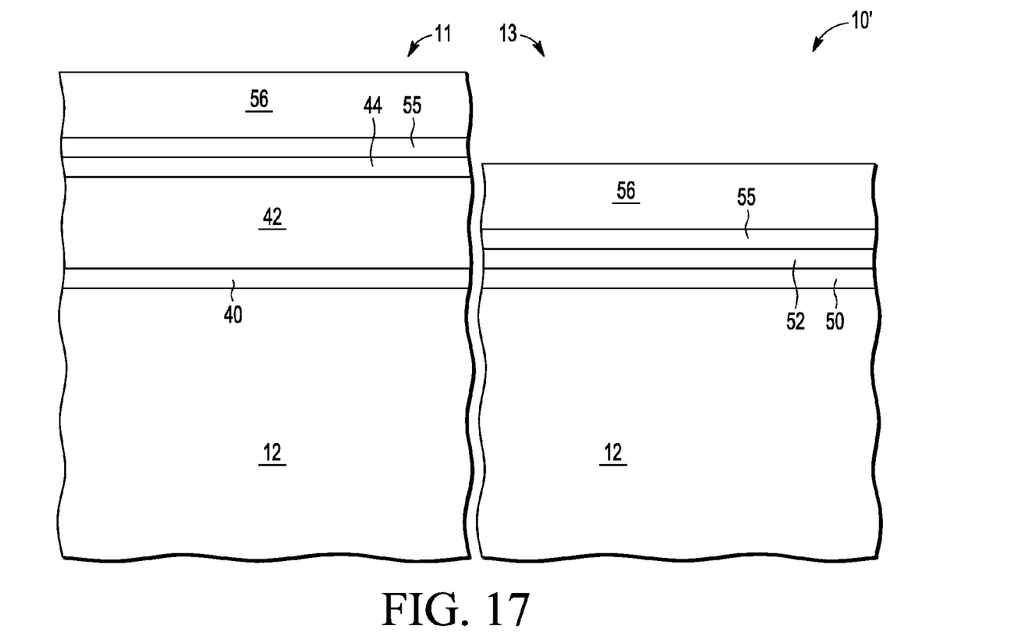

FIG. 17 illustrates semiconductor device 10' after barrier layer 55, and metal gate 56 are formed over charge storage layer 44 in NVM region 11 and over barrier layer 52 in logic transistor region 13. Following the formation of barrier layer 52, NVM region 11 includes a single metal barrier layer and logic transistor region 13 includes two metal barrier layers, where the combination of metal barrier layers 52 and 55 provides a double thickness of barrier metal. Metal barrier layer 55 sets the work function for transistors in region 13 when metal is used for the control gate. Metal barrier layer 55 may be similar in composition and thickness as barrier layer 52, but can also be different. If the control gate is formed from polysilicon, barrier layer 55 is not needed.

Figure 18:
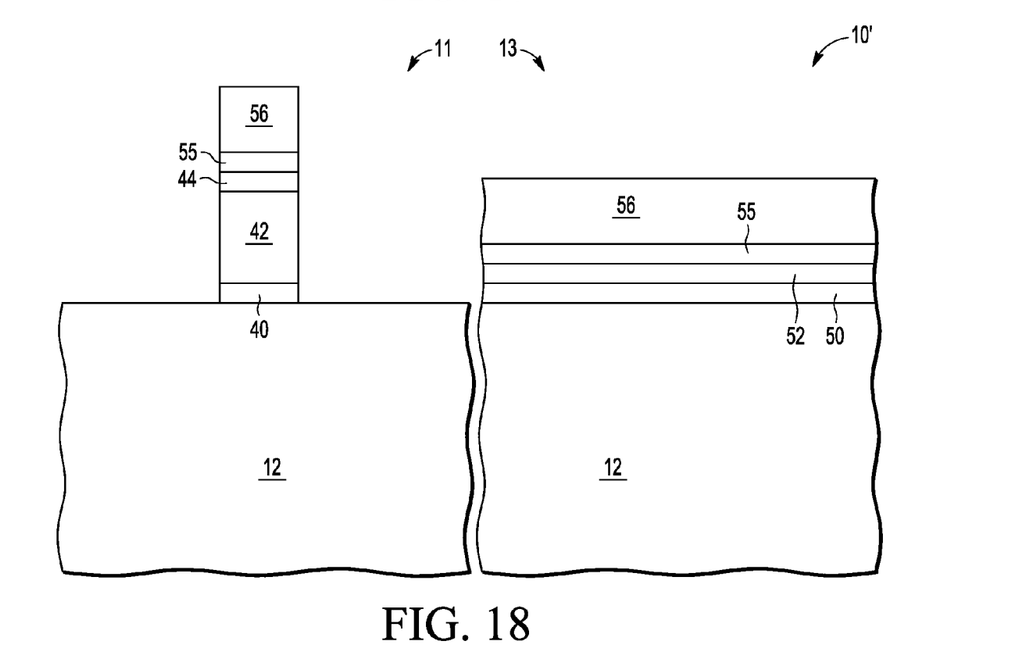

FIG. 18 illustrates semiconductor device 10' after a floating-gate type NVM cell has been patterned. In one embodiment, an array of floating-gate type NVM cells would be formed.

Figure 19:
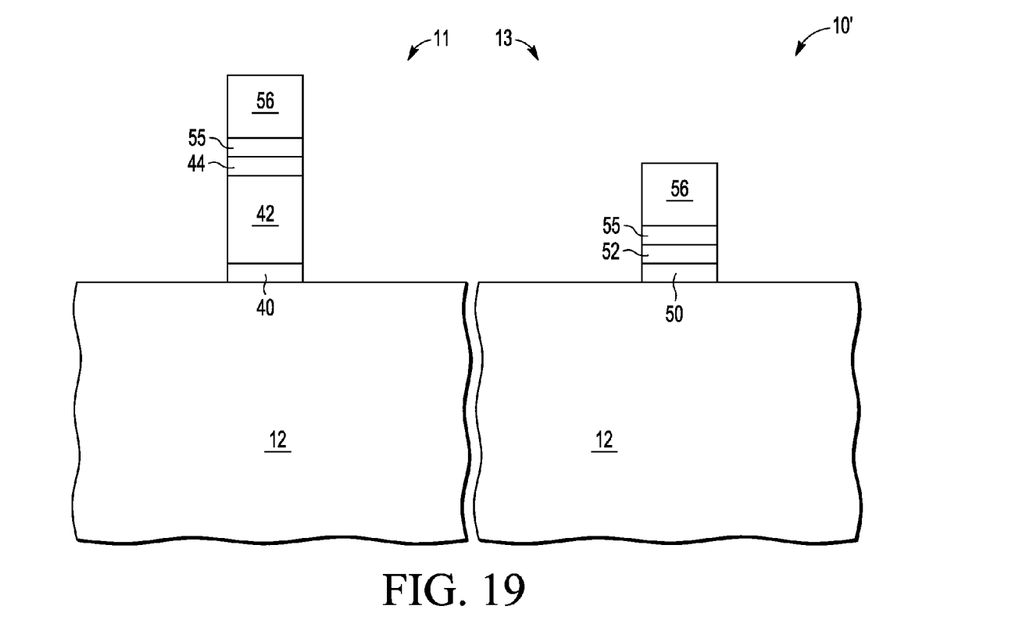

FIG. 19 illustrates semiconductor device 10' after a logic transistor has been patterned. In one embodiment, more than one logic transistor will be formed.

Figure 20:
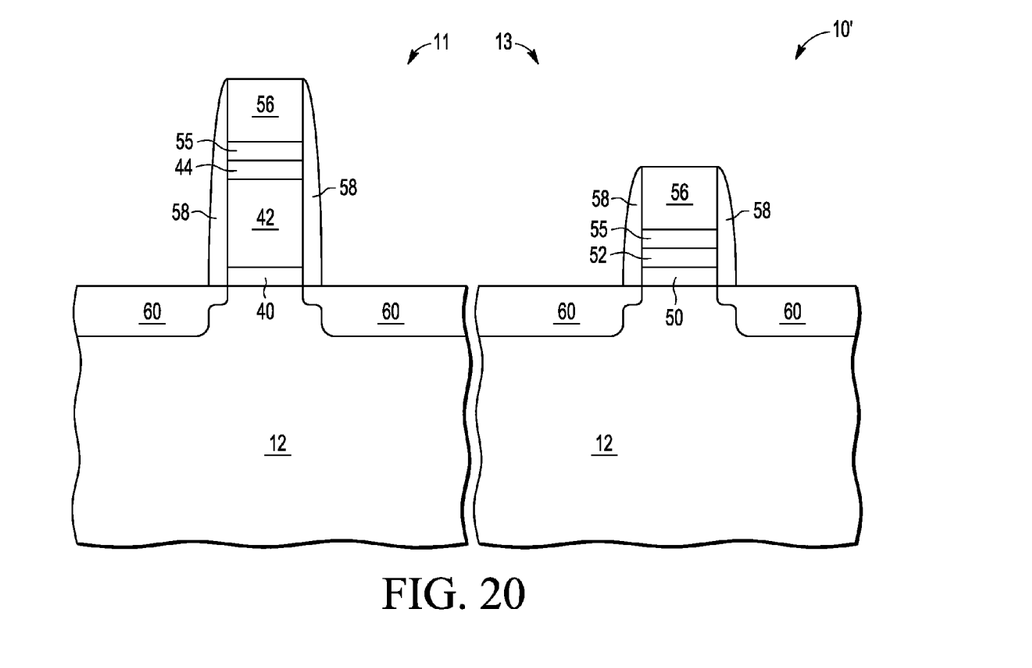

FIG. 20 illustrates semiconductor device 10' after further processing is performed. For example, sidewall spacers 58 are formed on sidewalls of the NVM transistors and the logic transistors. Also, source/drain regions 60 are formed in substrate 12. In addition, one or more metal interconnect layers (not shown) may be formed over semiconductor device 10' to provide electrical connections for the logic transistors, memory cells, and other components on semiconductor device 10'.

Note that in another embodiment, the logic transistor region may include different transistor stacks for NMOS and PMOS transistors that would be integrated in the same manner. Also note that a number of intermediate steps have been left out of the description, such as for example, formation of shallow trench isolation (STI), various cleaning steps, multiple steps of gate dielectric formation, various implants, anneal steps, and the like, that one of ordinary skill in the art would know are necessary or desirable in the manufacture of a semiconductor device.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A non-volatile memory cell and a logic transistor on a substrate, comprising:
    a first gate dielectric comprising silicon oxide over the substrate;
    a second gate dielectric of high-k material over the substrate spaced from the first gate dielectric;
    a first portion of a first conductive layer over the first gate dielectric;
    a first portion of a first metal layer on the second gate dielectric;
    a dielectric layer over the first portion of the first conductive layer;
    a first portion of a second metal layer over the first portion of the first metal layer;
    a second portion of the second metal layer over the dielectric layer;
    a first portion of a second conductive layer over the first portion of the second metal layer; and
    a second portion of the second conductive layer over the second portion of the second metal layer.

2. The non-volatile memory of claim 1, wherein the first metal layer and the second metal layer have the same work function.

3. The non-volatile memory of claim 1, wherein the dielectric layer comprises a charge storage layer comprising a first insulating layer, a plurality of nanocrystals over the first insulating layer, and a second insulating layer around and over the plurality of nanocrystals.

4. The non-volatile memory of claim 1, wherein the dielectric layer comprises a first oxide insulating layer, a silicon nitride insulating layer over the first oxide insulating layer, and a second oxide insulating layer over the silicon nitride insulating layer.

5. The non-volatile memory of claim 1, wherein the first portion of the first conductive layer is a floating gate comprising polysilicon.

6. The non-volatile memory of claim 1, wherein the second conductive layer comprises polysilicon.

7. A logic transistor in a logic region of a substrate and a non-volatile memory (NVM) cell in an NVM region of the substrate, comprising:
    a gate dielectric on the substrate in the NVM region;
    a patterned, first conductive layer on the gate dielectric in the NVM region;
    a dielectric layer over the first conductive layer in the NVM region;
    a high-k dielectric on the substrate in the logic region;
    a first metal layer over the high-k dielectric in the logic region; and
    a second conductive layer having a first portion over the dielectric layer in the NVM region and having a second portion over the first metal layer in the logic region; and
    wherein the NVM cell is formed from the gate dielectric, the first conductive layer, the dielectric layer, and the first portion of the second conductive layer, and the logic transistor is formed from the high-k dielectric, the first metal layer, and the second portion of the second conductive layer.

8. The logic transistor and the NVM cell of claim 7, wherein the first conductive layer comprises a first polysilicon layer.

9. The logic transistor and the NVM cell of claim 7, wherein the dielectric layer comprises a charge storage layer comprising a first insulating layer, a plurality of nanocrystals over the first insulating layer, and a second insulating layer around and over the plurality of nanocrystals.

10. The logic transistor and the NVM cell of claim 7, wherein the first conductive layer forms a floating gate.

* * * * *